United States Patent
Lee et al.

(10) Patent No.: US 10,156,741 B2
(45) Date of Patent: Dec. 18, 2018

(54) ELECTRO-OPTIC MODULATOR DEVICE, OPTICAL DEVICE AND METHOD OF MAKING AN OPTICAL DEVICE

(71) Applicant: Taiwan Semiconductor Manufacturing Company, Ltd., Hsin-Chu (TW)

(72) Inventors: Wan-Yu Lee, Taipei (TW); Ying-Hao Kuo, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/380,850

(22) Filed: Dec. 15, 2016

(65) Prior Publication Data
US 2017/0097527 A1 Apr. 6, 2017

Related U.S. Application Data

(63) Continuation of application No. 14/873,258, filed on Oct. 2, 2015, now Pat. No. 9,523,869, which is a continuation of application No. 14/089,801, filed on Nov. 26, 2013, now Pat. No. 9,153,940.

(51) Int. Cl.
| | |
|---|---|
| G02F 1/025 | (2006.01) |
| H01S 5/183 | (2006.01) |
| G02F 1/015 | (2006.01) |
| G02F 1/017 | (2006.01) |
| H01S 5/042 | (2006.01) |

(52) U.S. Cl.
CPC .............. *G02F 1/025* (2013.01); *G02F 1/015* (2013.01); *G02F 1/01716* (2013.01); *H01S 5/18302* (2013.01); *G02F 2201/12* (2013.01); *G02F 2201/307* (2013.01); *G02F 2201/34* (2013.01); *G02F 2201/38* (2013.01); *H01S 5/0425* (2013.01); *H01S 5/18341* (2013.01); *H01S 2301/176* (2013.01)

(58) Field of Classification Search
CPC .. G02F 1/025; G02F 2201/38; G02F 2201/12; G02F 2201/34; H01S 5/18302
USPC .............. 359/245, 248, 247, 246, 278, 279; 257/98, 437; 385/1, 2, 4, 8
See application file for complete search history.

(56) References Cited

U.S. PATENT DOCUMENTS

| | | | |
|---|---|---|---|
| 5,742,423 A * | 4/1998 | Ido .................... | B82Y 20/00 359/248 |
| 5,760,419 A | 6/1998 | Nablev et al. | |
| 5,821,570 A * | 10/1998 | Kazmierski .......... | G02F 1/025 257/101 |
| 6,339,496 B1 | 1/2002 | Koley et al. | |
| 7,375,378 B2 | 5/2008 | Manivannan et al. | |
| 2008/0044128 A1 | 2/2008 | Kish | |

* cited by examiner

*Primary Examiner* — Tuyen Tra
(74) *Attorney, Agent, or Firm* — Slater Matsil, LLP

(57) ABSTRACT

An electro-optic modulator device includes a modulation region, a reflecting region, a conductive line and an anti-reflecting region. The modulation region includes a doped region. The reflecting region is over the modulation region. The conductive line is connected to the doped region. The conductive line extends through the reflecting region. The anti-reflecting region is on an opposite surface of the modulation region from the reflecting region.

20 Claims, 4 Drawing Sheets

ELECTRO-OPTIC MODULATOR DEVICE, OPTICAL DEVICE AND METHOD OF MAKING AN OPTICAL DEVICE

PRIORITY CLAIM AND CROSS-REFERENCE

This application is a continuation of U.S. patent application Ser. No. 14/873,258, filed on Oct. 2, 2015, and entitled "Electro-Optic Modulator Device, Optical Device and Method of Making an Optical Device" which claims the benefit to and is a continuation of U.S. patent application Ser. No. 14/089,801, filed on Nov. 26, 2013, and entitled "Electro-Optic Modulator Device and Method of Making the Same," now U.S. Pat. No. 9,153,940 issued on Oct. 6, 2015, which applications are incorporated herein by reference.

BACKGROUND

Optical signals are usable for various applications including high speed and secure data transmission between two devices. In some applications, a semiconductor device includes at least an integrated circuit (IC or "chip") having an optical component. An electro-optic effect is a change in the optical properties of a material in response to an applied electric field that varies at a lower frequency when compared with the frequency of light. Modulation is the process of varying one or more properties of a periodic waveform, called a carrier signal, with a modulating signal. An electro-optic modulator (EOM) is an optical semiconductor device in which a signal-controlled element/material exhibiting the electro-optic effect is used to modulate a beam of light. The phase, frequency, amplitude, or polarization of the beam of light may be modulated.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1:
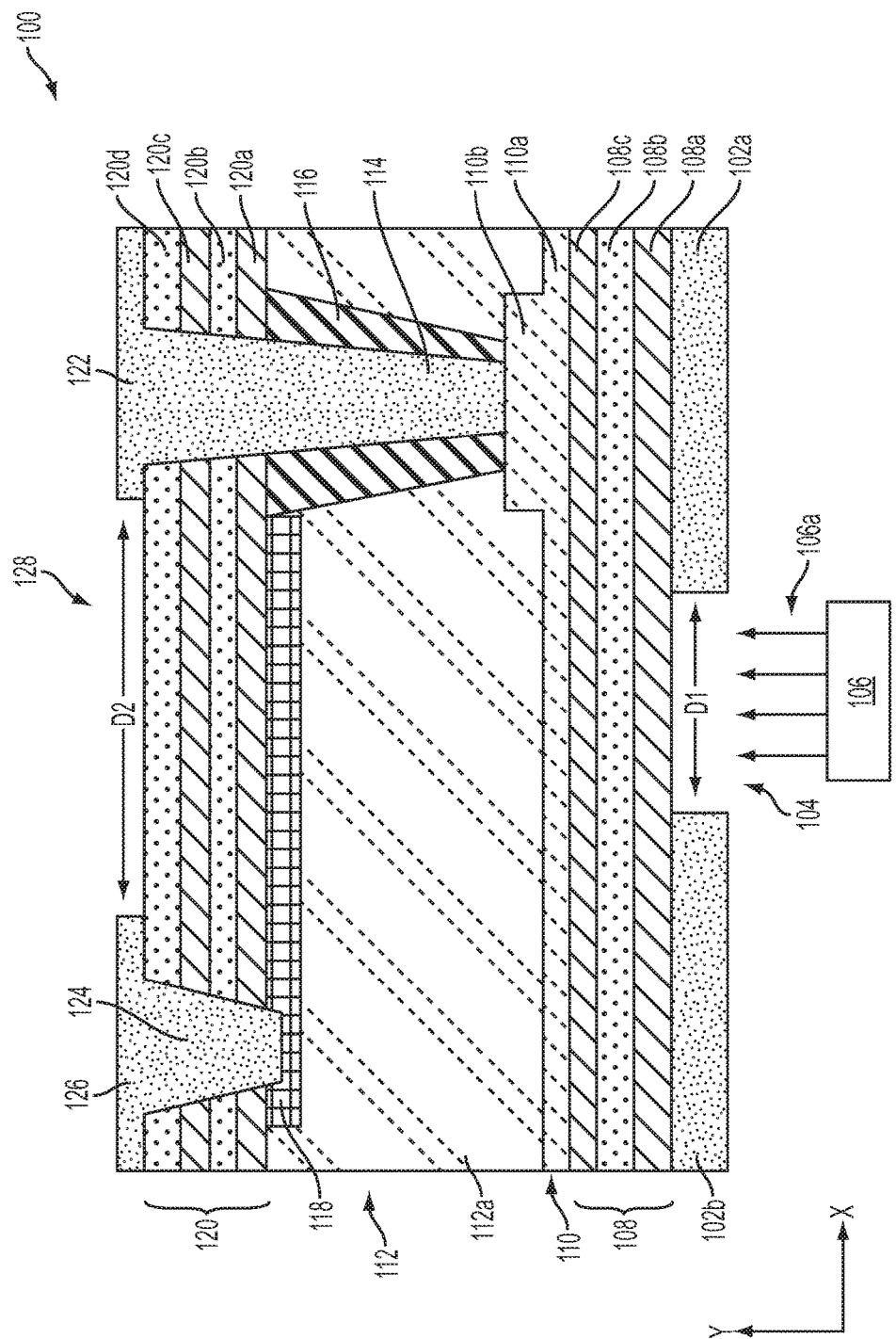
FIG. 1 is a cross sectional view of an Electro-Optic Modulator (EOM) structure m accordance with one or more embodiments.

The following disclosure provides many different embodiments, or examples, for implementing different features of the disclosed subject matter. Specific examples of components and arrangements are described below to simplify the present disclosure. These are examples and are not intended to be limiting.

This description of the embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

FIG. 1 is a cross-sectional view of an EOM structure 100 in accordance with one or more embodiments. EOM structure 100 comprises base conductive line 102a, base conductive line 102b, first opening 104, Anti-Reflective Coating (ARC) region 108, first doped region 110, modulation region 112, first conductive line 114, first passivation region 116, second doped region 118, first upper reflecting region 120, first conductive layer 122, second conductive line 124, second conductive layer 126 and second opening 128.

A base conductive line 102a and base conductive line 102b are adjacent to another and separated by a distance D1. The placement of the base conductive line 102a and base conductive line 102b forms the first opening 104 between each conductive line. The first opening 104 has a width of distance D1. In some embodiments, the distance D1 is a diameter of the first opening 104. In some embodiments, the first opening 104 is circular, rectangular, square, hexagonal, or other geometric shapes. In some embodiments, a distance D1 ranges from about 5 µm to about 20 µm.

In some embodiments, the base conductive line 102a and base conductive line 102b include more than one conductive portion. In some embodiments, base conductive line 102a or base conductive line 102b is in a two-dimensional plane. In some embodiments, base conductive line 102a and base conductive line 102b are three-dimensional structures. In some embodiments, the three-dimensional structure includes a combination of conductive lines on different layers of EOM structure 100. In some embodiments, base conductive line 102a or base conductive line 102b extend parallel to another. In some embodiments, base conductive line 102a or base conductive line 102b extends along an angled direction with respect to an x-axis and a y-axis of EOM structure 100.

In some embodiments, the base conductive line 102a and base conductive line 102b include a single port for either receiving or outputting an electrical current. In some embodiments, the base conductive line 102a and base conductive line 102b include more than one port and are each capable of both receiving and outputting an electrical current. In some embodiments, base conductive line 102a and base conductive line 102b include copper, aluminum, nickel, tungsten, titanium, or another suitable conductive material. In some embodiments, a thickness of base conductive line 102a ranges from about 500 nm to about 5 µm. In some embodiments, a thickness of base conductive line 102b ranges from about 500 nm to about 5 µm.

The first opening 104 receives electromagnetic radiation 106a from an electromagnetic radiation source 106. The electromagnetic radiation 106a includes a collimated signal. In some embodiments, a wavelength of the electromagnetic radiation 106a ranges from about 925 nanometers (nm) to about 2 μm. In some embodiments, the electromagnetic radiation 106a includes infrared light. In some embodiments, the electromagnetic radiation source 106 includes a III-V semiconductor material device. In some embodiments, the electromagnetic radiation source 106 includes a III-V semiconductor Vertical Cavity Surface Emitted Laser (VC-SEL). In some embodiments, EOM structure 100 is configured to receive an infrared signal with a diameter ranging from about 5 μm to about 20 μm. In some embodiments, EOM structure 100 is configured to receive an infrared signal with an optical power ranging from about 100 nW to about 20 mW.

ARC region 108 is over base conductive line 102a, base conductive line 102b and first opening 104. ARC region 108 includes layers of materials, e.g., ARC layers 108a, 108b and 108c, having corresponding refractive indices, e.g., $n_{108a}$, $n_{108b}$, $n_{108c}$, to reduce the reflection of incident electromagnetic radiation 106a, thereby improving the efficiency of the EOM structure 100. ARC region 108 includes ARC layers 108a, 108b and 108c. In some embodiments, ARC region 108 includes one or more ARC layers. ARC layer 108c is over ARC layer 108b and ARC layer 108a. ARC layer 108b is over ARC layer 108a. ARC layer 108a is over base conductive line 102a, base conductive line 102b and first opening 104.

In some embodiments, ARC region 108 is positioned in a two-dimensional plane which is parallel to the base conductive line 102a and base conductive line 102b. In some embodiments, ARC region 108 is a three-dimensional structure over base conductive line 102a and base conductive line 102b. In some embodiments, each ARC layer 108a, 108b and 108c is positioned in a two-dimensional plane which is parallel to each ARC layer 108a, 108b and 108c.

In some embodiments, ARC region 108 comprises a stack of alternating layers of anti-reflecting materials, e.g., ARC layers 108a, 108b and 108c, with alternating high and low refractive indices. In some embodiments, ARC layers 108a and 1086c are the same material and the corresponding indices of refraction, $n_{108a}$ and $n_{108c}$, are equal. In some embodiments, ARC layer 108a is a different material from ARC layer 108b, and the corresponding indices of refraction, $n_{108a}$ and $n_{108b}$ are not equal. In some embodiments, ARC layer 108c is a different material from ARC layer 108b, and the corresponding indices of refraction, $n_{108c}$ and $n_{108b}$, are not equal.

In some embodiments, ARC 108 region reflects about 3% of all incident radiation waves. In some embodiments, the number of ARC layers ranges from about 3 layers to about 10 layers. In some embodiments, ARC region 108 reduces chaotic oscillation/resonance of the incident electromagnetic radiation 106a from the ARC 108/base conductive line 102a, base conductive line 102b and first opening 104 interface. In some embodiments, the thickness of each ARC layer 108a, 108b and 108c ranges from about 230 nm to about 500 nm.

In some embodiments, the index of refraction ($n_{108a}$) for the ARC layer 108a ranges from about 1.6 to about 2.8. In some embodiments, the index of refraction ($n_{108b}$) for the ARC layer 108b ranges from about 1.3 to about 2.0. In some embodiments, the index of refraction ($n_{108}$) for the ARC layer 108c ranges from about 1.6 to about 2.8. In some embodiments, one or more of ARC reflecting layer 108a or ARC reflecting layer 108c includes a dielectric material comprising $SiO_2$, low-k dielectrics; any other suitable material; or combinations thereof. In some embodiments, ARC reflecting layer 108b includes a dielectric material comprising SiN; SiON; high-k dielectrics; any other suitable material; or combinations thereof. In some embodiments, ARC reflecting region 108 includes a dielectric material including $SiO_2$; SiN; SiON; low-k dielectrics; high-k dielectrics; any other suitable material; or combinations thereof. In some embodiments, the ARC region 108 is formed by CVD, ALD, or other processes. In some embodiments, the ARC region 108 has a multilayer structure and is formed in a multiple-step process. In some embodiments, the thickness of each ARC reflecting layer 108a, 108b and 108c ranges from about 60 nm to about 400 nm. In some embodiments, the thickness of ARC region 108 ranges from about 60 nm to about 400 nm.

Modulation region 112 is over ARC region 108. Modulation region 112 includes a semiconductor region 112a between a first doped region 110 of the semiconductor region and a second doped region 118 of the semiconductor region. In some embodiments, modulation region 112 is positioned in a two-dimensional plane which is parallel to the ARC region 108. In some embodiments, modulation region 112 is a three-dimensional structure over ARC region 108. In some embodiments, first doped region 110 is adjacent to the modulation region 112 and ARC region 108 interface. In some embodiments, second doped region 118 is adjacent to the modulation region 112 and first upper reflecting region 120 interface.

In some embodiments, modulation region 112 includes a P-I-N junction, where the P-region and N-region include first doped region 110 and the second doped region 118, and the I-region includes a lightly doped near-intrinsic semiconductor region 112a. In some embodiments, the semiconductor region 112a includes a bulk material or a quantum well. In some embodiments, the quantum well includes a single quantum well. In some embodiments, the quantum well includes a multiple quantum well including multiple quantum well layers. In some embodiments, the bulk material includes an elemental semiconductor including silicon or germanium in crystal, polycrystalline, or an amorphous structure, an alloy semiconductor including SiGe; any other suitable material; or combinations thereof. In some embodiments, the multiple quantum well includes alternating layers of $Si_xGe_{1-x}/Si_yGe_{1-y}$ where $0<=x$ and $y<=1$. In some embodiments, the number of quantum well layers ranges from about 1 layer to about 31 layers. In some embodiments, the thickness of the modulation region 112 is less than or about equal to 2 μm. In some embodiments, semiconductor region 112a includes an elementary semiconductor including silicon or germanium in crystal, polycrystalline, or an amorphous structure, an alloy semiconductor including SiGe; any other suitable material; or combinations thereof. In some embodiments, the modulation region 112 is formed by backside illuminated processes, KOH backside etch processes with an implantation etch stop; or other suitable processes. In some embodiments, the modulation region 112 is formed in a multiple-step process.

First doped region 110 is over the ARC region 108. First doped region 110 includes a lower first doped region 110a and an upper first doped region 110b. In some embodiments, first doped region 110 is positioned in a two-dimensional plane which is parallel to the ARC region 108. In some embodiments, first doped region 110 is a three-dimensional structure over ARC region 108. In some embodiments, lower first doped region 110a is positioned in a two-dimensional plane which is parallel to the ARC region 108. In some embodiments, lower first doped region 110a is a three-dimensional structure over ARC region 108. In some embodiments, lower first doped region 110a is positioned along the modulation region 112/ARC region 108 interface.

In some embodiments, upper first doped region 110b is electrically connected to first conductive line 114. In some embodiments, the upper first doped region 110b is a doped contact implant.

Second doped region 118 is over the first doped region 110 and the ARC region 108. In some embodiments, second doped region 118 is positioned in a two-dimensional plane which is parallel to the ARC region 108. In some embodiments, second doped region 118 is a three-dimensional structure over ARC region 108. In some embodiments, second doped region 118 is positioned adjacent an interface formed by the modulation region 112 and first upper reflecting region 120.

In some embodiments, first doped region 110 or second doped region 118 are doped with dopants utilized for Silicon, Silicon/Germanium and Germanium. In some embodiments, first doped region 110 is doped with an n-type material, including Phosphorous or Arsenic, or any other suitable material, and second doped region 118 is doped with a p-type material, including Boron, or any other suitable material. In some embodiments, first doped region 110 is doped with a p-type material, including Boron, or any other suitable material, and second doped region 118 is doped with an n-type material, including Phosphorous or Arsenic, or any other suitable material. In some embodiments, the thickness of the first doped region 110 ranges from about 30 nm to about 300 nm. In some embodiments, the thickness of the second doped region 118 ranges from about 30 nm to about 300 nm. In some embodiments, the dopant concentration of the first doped region 110 ranges from about $10^{17}$ ions/cm$^3$ to about $10^{20}$ ions/cm$^3$. In some embodiments, the dopant concentration of the second doped region 118 ranges from about $10^{17}$ ions/cm$^3$ to about $10^{20}$ ions/cm$^3$.

First upper reflecting region 120 is over the modulation region 112. First upper reflecting region 120 includes layers of materials, e.g., first upper reflecting layers 120a, 120b, 120c and 120d, having corresponding refractive indices, e.g., $n_{120a}$, $n_{120b}$, $n_{120c}$ and $n_{120d}$ in order to reflect incident electromagnetic radiation 106a, and improving the efficiency of the EOM structure 100. In some embodiments, first upper reflecting region 120 is a distributed Bragg reflector, which uses alternating layers of materials having different refractive indices to reflect emitted light from modulation region 112.

First upper reflecting region 120 includes first upper reflecting layers 120a, 120b, 120c and 120d. In some embodiments, first upper reflecting region 120 includes one or more reflecting layers. First upper reflecting layer 120d is over first upper reflecting layer 120c, first upper reflecting layer 120b and first upper reflecting layer 120a. First upper reflecting layer 120c is over first upper reflecting layer 120b and first upper reflecting layer 120a. First upper reflecting layer 120b is over first upper reflecting layer 120a. First upper reflecting layer 120a is over modulation region 112.

In some embodiments, first upper reflecting region 120 is positioned in a two-dimensional plane which is parallel to the modulation region 112. In some embodiments, first upper reflecting region 120 is a three-dimensional structure over modulation region 112. In some embodiments, each first upper reflecting layer 120a, 120b, 120c and 120d is positioned in a two-dimensional plane which is parallel to each first upper reflecting layer 120a, 120b, 120c and 120d.

In some embodiments, first upper reflecting region 120 comprises a stack of alternating layers of reflecting materials, e.g., first upper reflecting layers 120a, 120b, 120c and 120d, with alternating high and low refractive indices. In some embodiments, first upper reflecting layers 120a and 120c are the same material and the corresponding indices of refraction, $n_{120a}$ and $n_{120c}$, are equal. In some embodiments, first upper reflecting layers 120b and 120d are the same material, and the corresponding indices of refraction, $n_{120b}$ and $n_{120d}$ are equal. In some embodiments, first upper reflecting layer 120a is a different material from first upper reflecting layer 120b, and the corresponding indices of refraction, $n_{120a}$ and $n_{120b}$, are not equal. In some embodiments, first upper reflecting layer 120c is a different material from first upper reflecting layer 120b, and the corresponding indices of refraction, $n_{120c}$ and $n_{120b}$ are not equal. In some embodiments, first upper reflecting layer 120c is a different material from first upper reflecting layer 120d, and the corresponding indices of refraction, $n_{120c}$ and $n_{120d}$ are not equal.

In some embodiments, the index of refraction, $n_{120a}$, for the first upper reflecting layer 120a ranges from about 2.0 to about 3.4. In some embodiments, the index of refraction, $n_{120b}$ for the first upper reflecting layer 120b ranges from about 1.3 to about 1.6. In some embodiments, the index of refraction, $n_{120c}$ for the first upper reflecting layer 120c ranges from about 2.0 to about 3.4. In some embodiments, the index of refraction, $n_{120d}$ for the first upper reflecting layer 120d ranges from about 1.3 to about 1.6.

In some embodiments, the first upper reflecting layer 120a includes a dielectric material with a high refractive index including SiN$_x$ (where x<1); AlN; Si; high-k dielectric; any other suitable material; or combinations thereof. In some embodiments, the first upper reflecting layer 120b includes a dielectric material with a low refractive index including SiO$_2$; low-k dielectric; any other suitable material; or combinations thereof. In some embodiments, the first upper reflecting layer 120c includes a dielectric material with a high refractive index including SiN$_x$ (where x<1); AlN; Si; high-k dielectric; any other suitable material; or combinations thereof. In some embodiments, the first upper reflecting layer 120d includes a dielectric material with a low refractive index including SiO$_2$; low-k dielectric; any other suitable material; or combinations thereof.

In some embodiments, the first upper reflecting region 120 is formed by chemical vapor deposition (CVD), atomic layer deposition (ALD), or other processes. In some embodiments, the first upper reflecting region 120 is formed without the use of III-V epitaxial layers. In some embodiments, the first upper reflecting region 120 has a multilayer structure and is formed in a multiple-step process. In some embodiments, the number of first upper reflecting layers ranges from about 10 layers to about 20 layers. In some embodiments, the thickness of each first upper reflecting layer 120a, 120b, 120c and 120d ranges from about 60 nm to about 400 nm.

First conductive line 114 extends through first upper reflecting region 120 and partially through modulation region 112. First conductive line 114 is used to electrically connect first conductive layer 122 to first doped region 110. In some embodiments, first conductive line 114 is a metal line, a via, a through silicon via (TSV), an inter-level via (ILV), or another suitable conductive line. In some embodiments, first conductive line 114 includes copper, aluminum, nickel, titanium, tungsten or another suitable conductive material. In some embodiments, first conductive line 114 is a same material as first conductive layer 122. In some embodiments, first conductive line 114 is a different material from first conductive layer 122. In some embodiments, first conductive line 114 includes one or more conductive line portions. In some embodiments, first conductive line 114 is in first doped region 110.

First conductive layer 122 is over first upper reflecting region 120 and is used to electrically connect to the first doped region 110 by the first conductive line 114. In some embodiments, the first conductive layer 122 includes more than one conductive portion. In some embodiments, first conductive layer 122 is in a two-dimensional plane. In some embodiments, first conductive layer 122 is a three-dimensional structure. In some embodiments, the three-dimensional structure includes a combination of conductive lines on different layers of EOM structure 100. In some embodiments, first conductive layer 122 extends parallel to first upper reflecting region 120. In some embodiments, first conductive layer 122 extends along an angled direction with respect to an x-axis and a y-axis of EOM structure 100.

In some embodiments, first conductive layer 122 includes a single port for either receiving or outputting an electrical current. In some embodiments, first conductive layer 122 includes more than one port and is capable of both receiving and outputting an electrical current. In some embodiments, first conductive layer 122 includes copper, aluminum, nickel, tungsten, titanium, or another suitable conductive material. In some embodiments, a thickness of the first conductive layer 122 ranges from about 0.5 μm to about 5 μm.

First passivation region 116 extends circumferentially around the outer surface of first conductive line 114. First passivation region 116 electrically isolates the first conductive line 114 from the second doped region 118. First passivation region 116 electrically isolates the first doped region 110 from the second doped region 118. In some embodiments, the first passivation region 116 includes a dielectric material including $SiO_2$ or SiN; any other suitable material; or combinations thereof. In some embodiments, the first passivation region 116 is formed by CVD, or other processes. In some embodiments, a thickness of the first passivation region 116 ranges from about 100 nm to about 3,000 nm.

Second conductive line 124 extends through first upper reflecting region 120 and partially through modulation region 112. Second conductive line 124 is used to electrically connect second conductive layer 126 to second doped region 118. In some embodiments, second conductive line 124 is a metal line, a via, a through silicon via (TSV), an inter-level via (ILV), or another suitable conductive line. In some embodiments, second conductive line 124 includes copper, aluminum, nickel, titanium, tungsten or another suitable conductive material. In some embodiments, second conductive line 124 is a same material as second conductive layer 126. In some embodiments, second conductive line 124 is a different material from second conductive layer 126. In some embodiments, second conductive line 124 includes one or more conductive line portions. In some embodiments, second conductive line 124 is in second doped region 118.

Second conductive layer 126 is over first upper reflecting region 120 and is used to electrically connect to the second doped region 118 by the second conductive line 124. In some embodiments, the second conductive layer 126 includes more than one conductive portion. In some embodiments, second conductive layer 126 is in a two-dimensional plane. In some embodiments, second conductive layer 126 is a three-dimensional structure. In some embodiments, the three-dimensional structure includes a combination of conductive lines on different layers of EOM structure 100. In some embodiments, second conductive layer 126 extends parallel to first upper reflecting region 120. In some embodiments, second conductive layer 126 extends along an angled direction with respect to an x-axis and a y-axis of EOM structure 100.

In some embodiments, second conductive layer 126 includes a single port for either receiving or outputting an electrical current. In some embodiments, second conductive layer 126 includes more than one port and is capable of both receiving and outputting an electrical current. In some embodiments, second conductive layer 126 includes copper, aluminum, nickel, tungsten, titanium, or another suitable conductive material. In some embodiments, a thickness of the second conductive layer 126 ranges from about 0.5 μm to about 5 μm.

A first conductive layer 122 and second conductive layer 126 are adjacent to another and separated by a distance D2. The placement of the first conductive layer 122 and second conductive layer 126 forms the second opening 128 between each conductive layer. The second opening 128 has a width of distance D2. In some embodiments, the distance D2 is a diameter of the second opening 128. In some embodiments, the second opening 128 is circular, rectangular, square, hexagonal, or other geometric shapes. In some embodiments, a distance D2 ranges from about 10 μm to about 20 μm. In some embodiments, the ratio of the distance D1:D2 ranges from about 1:3, 1:2.5, 1:2, 1:1.5, 1:1, 1.5:1, 2:1, 2.5:1 or 3:1.

In some embodiments, first conductive layer 122 and second conductive layer 126 are configured to receive a modulated input bias signal which ranges from about 0 to 1.5 volts for a quantum well semiconductor region 112a. In some embodiments, first conductive layer 122 and second conductive layer 126 are configured to receive a modulated input bias signal which ranges from about 0 to 5.0 volts for a bulk material semiconductor region 112a. In some embodiments, the modulated received input bias signal controls the refraction index of the modulating region 112, which controls the amount of modulation performed by the EOM structure 100. In some embodiments, EOM structure 100 is configured to operate with a bandwidth of about 50 Gigahertz (GHz). In some embodiments, EOM structure 100 is configured to output a modulated signal with an intensity which ranges from about 0.2 milliwatts (mw) to about 5 mw. In some embodiments, EOM structure 100 is configured to output an infrared modulated signal with a diameter of about 20 μm or less. In some embodiments, EOM structure 100 is configured to output an infrared signal for use in a single-mode optical fiber. In some embodiments, EOM structure 100 is configured to output an infrared signal for use in a multi-mode optical fiber. In some embodiments, EOM structure 100 is configured to output an infrared modulated signal with a wavelength ranging from about 925 nm to about 2000 nm. In some embodiments, the EOM structure 100 is usable for optical communications. In some embodiments, EOM structure 100 is configured to output a modulated signal to contain data. In some embodiments, EOM structure 100 is configured to output a modulated signal that is tunable. In some embodiments, EOM structure 100 is configured to output an amplitude modulated signal. In some embodiments, EOM structure 100 is configured to output a frequency modulated signal. In some embodiments, EOM structure 100 is configured to output a phase modulated signal. In some embodiments, EOM structure 100 is configured to output a polarization modulated signal.

Figure 2:
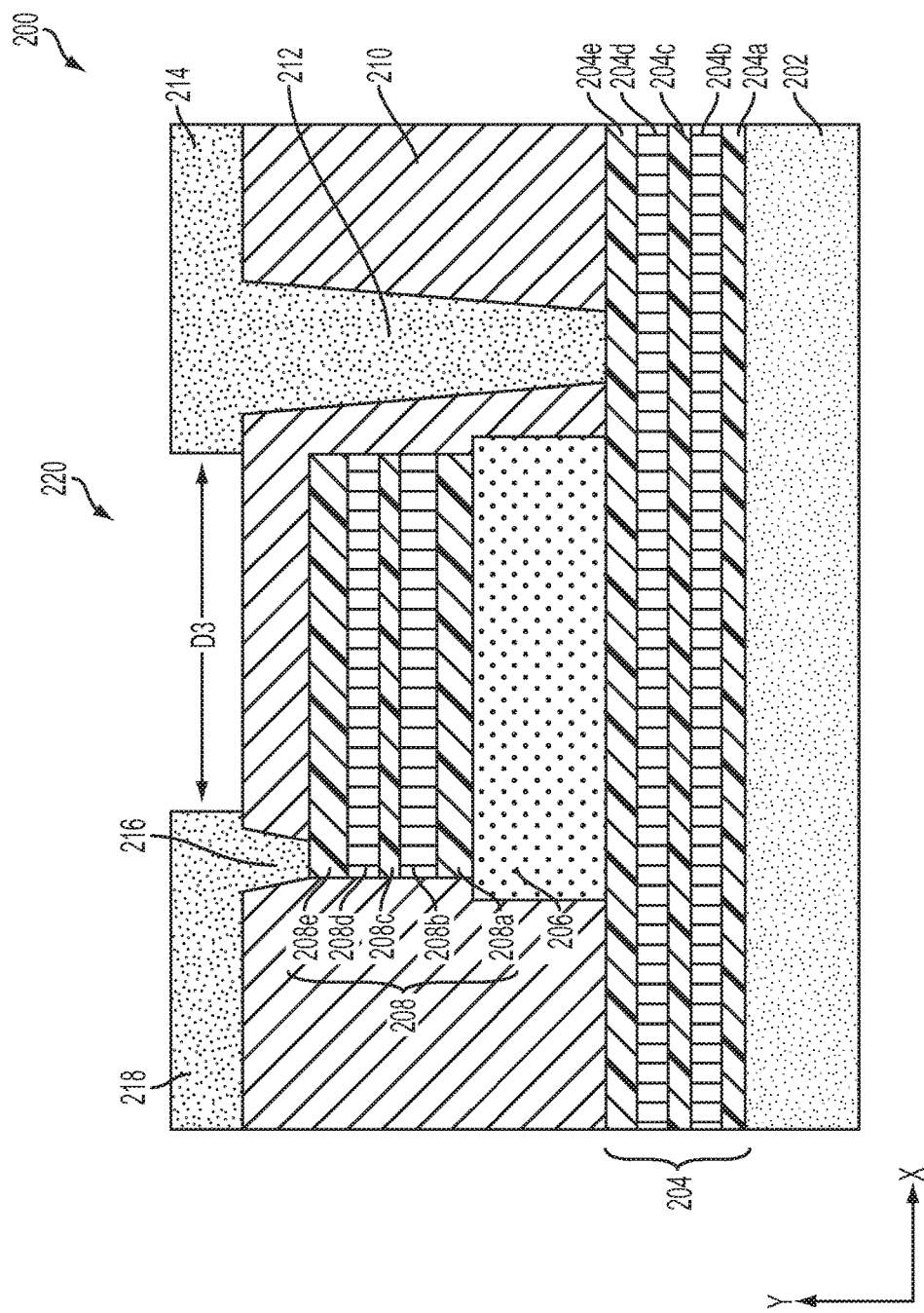
FIG. 2 is a cross sectional view of a Vertical Cavity Surface Emitting Laser (VCSEL) structure in accordance with one or more embodiments.

FIG. 2 is a cross-sectional view of a VCSEL structure 200 in accordance with one or more embodiments. VCSEL structure 200 is an embodiment of electromagnetic radiation source 106 shown in FIG. 1. VCSEL structure 200 comprises substrate 202, first lower reflecting region 204, active semiconductor region 206, second upper reflecting region 208, second passivation layer 210, third conductive line 212, third conductive layer 214, fourth conductive line 216, fourth conductive layer 218 and third opening 220.

In some embodiments, substrate 202 includes a compound semiconductor including gallium arsenic or indium phosphide; any other suitable material; or combinations thereof. In some embodiments, a thickness of the substrate 202 ranges from about 3 μm to about 350 μm. In some embodiments, the substrate 202 has a multilayer structure. In some embodiments, substrate 202 includes a III-V semiconductor combination.

First lower reflecting region 204 is over the substrate 202. First lower reflecting region 204 includes layers of materials, e.g., first lower reflecting layers 204a, 204b, 204c, 204d and 204e, having corresponding refractive indices, e.g., $n_{204a}$, $n_{204b}$, $n_{204c}$, $n_{204d}$ and $n_{204e}$, in order to reflect incident electromagnetic radiation. In some embodiments, first lower reflecting region 204 is a distributed Bragg reflector, which uses alternating layers of materials having different refractive indices to reflect emitted light from active semiconductor region 206.

First lower reflecting region 204 includes first lower reflecting layers 204a, 204b, 204c, 204d and 204e. In some embodiments, first lower reflecting region 204 includes one or more reflecting layers. First lower reflecting layer 204e is over first lower reflecting layer 204d, first lower reflecting layer 204c, first lower reflecting layer 204b and first lower reflecting layer 204a. First lower reflecting layer 204d is over first lower reflecting layer 204c, first lower reflecting layer 204b and first lower reflecting layer 204a. First lower reflecting layer 204c is over first lower reflecting layer 204b and first lower reflecting layer 204a. First lower reflecting layer 204b is over first lower reflecting layer 204a. First lower reflecting layer 204a is over substrate 202.

In some embodiments, first lower reflecting region 204 is positioned in a two-dimensional plane which is parallel to the substrate 202. In some embodiments, first lower reflecting region 204 is a three-dimensional structure over substrate 202. In some embodiments, each first lower reflecting layer 204a, 204b, 204c, 204d and 204e is positioned in a two-dimensional plane which is parallel to each first lower reflecting layer 204a, 204b, 204c, 204d and 204e.

In some embodiments, first lower reflecting region 204 comprises a stack of alternating layers of reflecting materials, e.g., first lower reflecting layers 204a, 204b, 204c, 204d and 204e, with alternating higher and lower refractive indices. In some embodiments, first lower reflecting layers 204a, 204c and 204e are the same material and the corresponding indices of refraction, $n_{204a}$, $n_{204e}$ and $n_{204e}$, are equal. In some embodiments, first lower reflecting layers 204b and 204d are the same material and the corresponding indices of refraction, n204b and n204d, are equal.

In some embodiments, first lower reflecting layer 204a is a different material from first lower reflecting layer 204b, and the corresponding indices of refraction, $n_{204a}$ and $n_{204b}$, are not equal. In some embodiments, first lower reflecting layer 204c is a different material from first lower reflecting layer 204b, and the corresponding indices of refraction, $n_{204e}$ and $n_{204b}$, are not equal. In some embodiments, first lower reflecting layer 204c is a different material from first lower reflecting layer 204d, and the corresponding indices of refraction, n204c and n204d, are not equal. In some embodiments, first lower reflecting layer 204d is a different material from first lower reflecting layer 204e, and the corresponding indices of refraction, $n_{204d}$ and $n_{204e}$, are not equal.

In some embodiments, the first lower reflecting layer 204a includes InGaAsP—InP, AlAs—AlGaAs, AlGaInAs—AlInAs, AlGaAsSb—AlAsSb; any other suitable material; or combinations thereof. In some embodiments, the first lower reflecting layer 204b includes InGaAsP—InP, AlAs—AlGaAs, AlGaInAs—AlInAs, AlGaAsSb—AlAsSb; any other suitable material; or combinations thereof. In some embodiments, the first lower reflecting layer 204c includes InGaAsP—InP, AlAs—AlGaAs, AlGaInAs—AlInAs, AlGaAsSb—AlAsSb; any other suitable material; or combinations thereof. In some embodiments, the first lower reflecting layer 204d includes InGaAsP—InP, AlAs—AlGaAs, AlGaInAs—AlInAs, AlGaAsSb—AlAsSb; any other suitable material; or combinations thereof. In some embodiments, the first lower reflecting layer 204e includes InGaAsP—InP, AlAs—AlGaAs, AlGaInAs—AlInAs, AlGaAsSb—AlAsSb; any other suitable material; or combinations thereof. In some embodiments, when additional reflecting layers are added to the first lower reflecting region 204, the additional layers include InGaAsP—InP, AlAs—AlGaAs, AlGaInAs—AlInAs, AlGaAsSb—AlAsSb; any other suitable material; or combinations thereof.

In some embodiments, the first lower reflecting region 204 is formed by CVD, ALD, or other processes. In some embodiments, the first lower reflecting region 204 has a multilayer structure and is formed in a multiple-step process. In some embodiments, the number of first lower reflecting layers ranges from about 10 layers to about 20 layers. In some embodiments, the thickness of each first lower reflecting layer 204a, 204b, 204c, 204d and 204e ranges from about 60 nm to about 200 nm.

Active semiconductor region 206 is over first lower reflecting region 204. In some embodiments, active semiconductor region 206 is positioned in a two-dimensional plane which is parallel to the first lower reflecting region 204. In some embodiments, active semiconductor region 206 is a three-dimensional structure over first lower reflecting region 204. In some embodiments, the active semiconductor region 206 includes layers of InGaAsP or AlGaInAs; any other suitable material; or combinations thereof. In some embodiments, the active semiconductor region 206 includes one or more quantum well layers. In some embodiments, each quantum well layer includes InGaAsP, AlGaInAs; any other suitable material; or combinations thereof. In some embodiments, active semiconductor region 206 includes a multiple quantum well where multiple well layers, e.g., InGaAsP and AlGaInAs, are positioned in an alternating pattern. In some embodiments, the thickness of the active semiconductor region 206 ranges from about 3 nm to about 12 nm. In some embodiments, active semiconductor region 206 includes layers of III-V materials which, when in use, emit infrared light.

Second upper reflecting region 208 is over the active semiconductor region 208. Second upper reflecting region 208 includes layers of materials, e.g., second upper reflecting layers 208a, 208b, 208c, 208d and 208e, having corresponding refractive indices, e.g., $n_{208a}$, $n_{208b}$, $n_{208c}$, $n_{208d}$ and $n_{208e}$, in order to reflect incident electromagnetic radiation. In some embodiments, second upper reflecting region 208 is a distributed Bragg reflector, which uses alternating layers of materials having different refractive indices to reflect emitted light from active semiconductor region 206.

Second upper reflecting region 208 includes second upper reflecting layers 208a, 208b, 208c, 208d and 208e. In some embodiments, second upper reflecting region 208 includes one or more reflecting layers. Second upper reflecting layer 208e is over second upper reflecting layer 208d, second upper reflecting layer 208c, second upper reflecting layer 208b and second upper reflecting layer 208a. Second upper reflecting layer 208d is over second upper reflecting layer 208c, second upper reflecting layer 208b and second upper reflecting layer 208a. Second upper reflecting layer 208c is over second upper reflecting layer 208b and second upper reflecting layer 208a. Second upper reflecting layer 208b is over second upper reflecting layer 208a. Second upper reflecting layer 208a is over active semiconductor region 206.

In some embodiments, second upper reflecting region 208 IS positioned in a two-dimensional plane which is parallel to the active semiconductor region 206. In some embodiments, second upper reflecting region 208 is a three-dimensional structure over active semiconductor region 208. In some embodiments, each second upper reflecting layer 208a, 208b, 208c, 208d and 208e is positioned in a two-dimensional plane which is parallel to each second upper reflecting layer 208a, 208b, 208c, 208d and 208e.

In some embodiments, second upper reflecting region 208 composes a stack of alternating layers of reflecting materials, e.g., second upper reflecting layers 208a, 208b, 208c, 208d and 208e, with alternating higher and lower refractive indices. In some embodiments, second upper reflecting layers 208a, 208c and 208e are the same material and the corresponding indices of refraction, $n_{208a}$, $n_{208c}$ and $n_{208e}$, are equal. In some embodiments, second upper reflecting layers 208b and 208d are the same material and the corresponding indices of refraction, $n_{208b}$ and $n_{208d}$, are equal.

In some embodiments, second upper reflecting layer 208a is a different material from second upper reflecting layer 208b, and the corresponding indices of refraction, $n_{208a}$ and $n_{208b}$, are not equal. In some embodiments, second upper reflecting layer 208c is a different material from second upper reflecting layer 208b, and the corresponding indices of refraction, $n_{208c}$ and $n_{208b}$, are not equal. In some embodiments, second upper reflecting layer 208c is a different material from second upper reflecting layer 208d, and the corresponding indices of refraction, $n_{208c}$ and $n_{208d}$, are not equal. In some embodiments, second upper reflecting layer 208d is a different material from second upper reflecting layer 208e, and the corresponding indices of refraction, $n_{208d}$ and $n_{208e}$, are not equal.

In some embodiments, the second upper reflecting layer 208a includes InGaAsP—InP, AlAs—AlGaAs, AlGaInAs—AlInAs, AlGaAsSb—AlAsSb; any other suitable material; or combinations thereof. In some embodiments, the second upper reflecting layer 208b includes InGaAsP—InP, AlAs—AlGaAs, AlGaInAs—AlInAs, AlGaAsSb—AlAsSb; any other suitable material; or combinations thereof. In some embodiments, the second upper reflecting layer 208c includes InGaAsP—InP, AlAs—AlGaAs, AlGaInAs—AlInAs, AlGaAsSb—AlAsSb; any other suitable material; or combinations thereof. In some embodiments, the second upper reflecting layer 208d includes InGaAsP—InP, AlAs—AlGaAs, AlGaInAs—AlInAs, AlGaAsSb—AlAsSb; any other suitable material; or combinations thereof. In some embodiments, the second upper reflecting layer 208e includes InGaAsP—InP, AlAs—AlGaAs, AlGaInAs—AlInAs, AlGaAsSb—AlAsSb; any other suitable material; or combinations thereof. In some embodiments, when additional reflecting layers are added to the second upper reflecting region 208, the additional layers include InGaAsP—InP, AlAs—AlGaAs, AlGaInAs—AlInAs, AlGaAsSb—AlAsSb; any other suitable material; or combinations thereof.

In some embodiments, the second upper reflecting region 208 is formed by CVD, ALD, or other processes. In some embodiments, the second upper reflecting region 208 has a multilayer structure and is formed in a multiple-step process. In some embodiments, the number of second upper reflecting layers ranges from about 5 layers to about 15 layers. In some embodiments, the thickness of each second upper reflecting layer 208a, 208b, 208c, 208d and 208e ranges from about 60 nm to about 200 nm.

Second passivation region 210 is over first lower reflecting region 204, active semiconductor region 206 and second upper reflecting region 208. Second passivation region 210 extends circumferentially around the outer surface of third conductive line 212 or fourth conductive line 216. Second passivation region 210 electrically isolates the third conductive line 212 from the second upper reflecting region 208. Second passivation region 210 electrically isolates the fourth conductive line 216 from the first lower reflecting region 204. Second passivation region 210 electrically isolates the first lower reflecting region 204 from the second upper reflecting region 208. In some embodiments, the second passivation region 210 includes a dielectric material with a high refractive index including $SiN_x$ (where x<1); any other suitable material; or combinations thereof. In some embodiments, the second passivation region 210 includes a dielectric material with a low refractive index including $SiO_2$; low-k dielectric; any other suitable material; or combinations thereof. In some embodiments, the second passivation region 210 is formed by CVD, spin-on polymeric dielectric or other processes. In some embodiments, the second passivation region 210 ranges from about 3 μm to about 20 μm. In some embodiments, the second passivation region 210 includes one or more layers.

Third conductive line 212 extends through second passivation region 210. Third conductive line 212 is used to electrically connect third conductive layer 214 to first lower reflecting region 204. In some embodiments, third conductive line 212 is a metal line, a via, a through silicon via (TSV), an inter-level via (ILV), or another suitable conductive line. In some embodiments, third conductive line 212 includes copper, aluminum, nickel, titanium, tungsten or another suitable conductive material. In some embodiments, third conductive line 212 is a same material as third conductive layer 214. In some embodiments, third conductive line 212 is a different material from third conductive layer 214. In some embodiments, third conductive line 212 includes one or more conductive line portions.

Third conductive layer 214 is over second passivation region 210 and is used to electrically connect to the first lower reflecting region 204 by the third conductive line 212. In some embodiments, the third conductive layer 214 includes more than one conductive portion. In some embodiments, third conductive layer 214 is in a two-dimensional plane. In some embodiments, third conductive layer 214 is a three-dimensional structure. In some embodiments, the three-dimensional structure includes a combination of conductive lines on different layers of VCSEL structure 200. In some embodiments, third conductive layer 214 extends parallel to second passivation region 210. In some embodiments, third conductive layer 214 extends along an angled direction with respect to an x-axis and a y-axis of VCSEL structure 200.

In some embodiments, third conductive layer 214 includes a single port for either receiving or outputting an electrical current. In some embodiments, third conductive layer 214 includes more than one port and is capable of both receiving and outputting an electrical current. In some embodiments, third conductive layer 214 includes copper, aluminum, nickel, tungsten, titanium, or another suitable conductive material. In some embodiments, a thickness of the third conductive layer 214 ranges from about 0.2 μm to about 5 μm.

Fourth conductive line 216 partially extends through second passivation region 210. Fourth conductive line 216 is used to electrically connect fourth conductive layer 218 to second upper reflecting region 208. In some embodiments, fourth conductive line 216 is a metal line, a via, a through silicon via (TSV), an inter-level via (ILV), or another suitable conductive line. In some embodiments, fourth conductive line 216 includes copper, aluminum, nickel, titanium, tungsten or another suitable conductive material. In some embodiments, fourth conductive line 216 is a same material as fourth conductive layer 218. In some embodiments, fourth conductive line 216 is a different material from fourth conductive layer 218. In some embodiments, fourth conductive line 216 includes one or more conductive line portions.

Fourth conductive layer 218 is over second passivation region 210 and is used to electrically connect to the second upper reflecting region 208 by the fourth conductive line 216. In some embodiments, the fourth conductive layer 218 includes more than one conductive portion. In some embodiments, fourth conductive layer 218 is in a two-dimensional plane. In some embodiments, fourth conductive layer 218 is a three-dimensional structure. In some embodiments, the three-dimensional structure includes a combination of conductive lines on different layers of VCSEL structure 200. In some embodiments, fourth conductive layer 218 extends parallel to second passivation region 210. In some embodiments, fourth conductive layer 218 extends along an angled direction with respect to an x-axis and a y-axis of VCSEL structure 200.

In some embodiments, fourth conductive layer 218 includes a single port for either receiving or outputting an electrical current. In some embodiments, fourth conductive layer 218 includes more than one port and is capable of both receiving and outputting an electrical current. In some embodiments, fourth conductive layer 218 includes copper, aluminum, nickel, tungsten, titanium, or another suitable conductive material. In some embodiments, a thickness of the fourth conductive layer 218 ranges from about 0.2 μm to about 5 μm.

A third conductive layer 214 and fourth conductive layer 218 are placed adjacent to another and separated by a distance D3. The placement of the third conductive layer 214 and fourth conductive layer 218 forms a third opening 220 between each conductive layer. The third opening 220 has a width of distance D3. In some embodiments, the distance D3 is a diameter of the third opening 220. In some embodiments, the third opening 220 is circular, rectangular, square, hexagonal, or other geometric shapes. In some embodiments, a distance D3 ranges from about 10 μm to about 15 μm. In some embodiments, third conductive layer 214 and fourth conductive layer 218 are configured to receive an input signal which controls the infrared laser output of VCSEL 200.

In some embodiments, VCSEL structure 200 is a III-V vertical cavity laser with an output wavelength ranging from about 925 nm to about 2000 nm. In some embodiments, VCSEL structure 200 is an upwardly directed vertical cavity laser. In some embodiments, VCSEL structure 200 is a downwardly directed vertical cavity laser. In some embodiments, VCSEL structure 200 is configured to operate with a bandwidth of about 50 Gigahertz (GHz).

Figure 3:
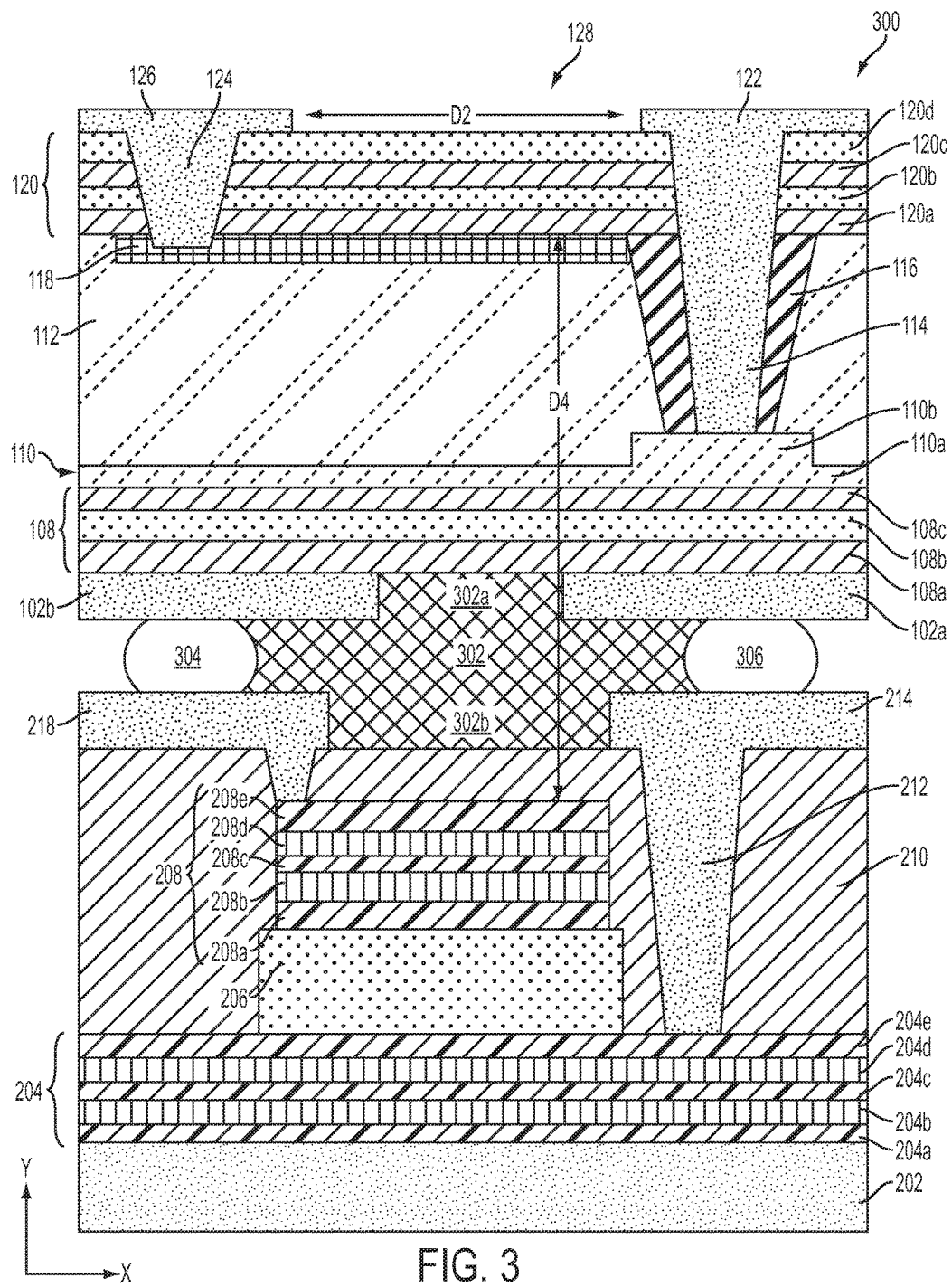
FIG. 3 is a cross sectional view of an EOM/VCSEL structure in accordance with one or more embodiments.

FIG. 3 is a cross-sectional view of an EOM/VCSEL structure 300 in accordance with one or more embodiments. EOM/VCSEL structure 300 includes an embodiment of EOM structure 100 shown in FIG. 1 with similar elements coupled to an embodiment of VCSEL structure 200 shown in FIG. 2 with similar elements. EOM/VCSEL structure 300 includes EOM structure 100, VCSEL structure 200, insulating region 302, first connector portion 304 and second connector portion 306. The EOM structure 100 and VCSEL structure 200 are placed adjacent to another. The top surface of the second upper reflecting region 208 is separated a distance D4 from the top surface of the modulation region 112. In some embodiments, the distance D4 is about 25 μm or less. In some embodiments, EOM structure 100 is bonded to the VCSEL structure 200 using a laser bonding process, a conductive adhesive layer, soldering process or another suitable bonding process.

First connector portion 304 is over fourth conductive layer 218 and is used to connect the EOM structure 100 to the VCSEL structure 200. First connector portion 304 is used to electrically connect base conductive line 102b to the fourth conductive layer 218. In some embodiments, the first connector portion 304 includes more than one conductive portion. In some embodiments, first connector portion 304 is in a two-dimensional plane. In some embodiments, first connector portion 304 is a three-dimensional structure. In some embodiments, the three-dimensional structure includes a combination of conductive lines on different layers. In some embodiments, the first connector portion 304 includes conductive materials including copper, aluminum, nickel, tungsten, titanium, or another suitable conductive material. In some embodiments, the first connector portion 304 includes a soldering material.

Second connector portion 306 is over third conductive layer 214 and is used to connect the EOM structure 100 to the VCSEL structure 200. Second connector portion 306 is used to electrically connect base conductive line 102a to the third conductive layer 214. In some embodiments, the second connector portion 306 includes more than one conductive portion. In some embodiments, second connector portion 306 is in a two-dimensional plane. In some embodiments, second connector portion 306 is a three-dimensional structure. In some embodiments, the three-dimensional structure includes a combination of conductive lines on different layers. In some embodiments, the second connector portion 306 includes conductive materials including copper, aluminum, nickel, tungsten, titanium, or another suitable conductive material. In some embodiments, the second connector portion 306 includes a soldering material.

Insulating region 302 is over VCSEL structure 200. Insulating region 302 is over second passivation region 210. Insulating region 302 is at least partially over third conductive layer 214 or fourth conductive layer 218. Insulating region 302 is below EOM structure 100. Insulating region 302 is below ARC region 108. Insulating region 302 is at least partially below base conductive line 102a and base conductive line 102b. Insulating region 302 at least partially fills where the first opening 104 is shown in the embodiment of FIG. 1 (shown as insulating region 302a in FIG. 3). Insulating region 302 at least partially fills where the third opening 220 is shown in the embodiment of FIG. 2 (shown as insulating region 302b in FIG. 3). In some embodiments, insulating region 302 partially fills the region between EOM structure 100 and VCSEL structure 200. In some embodiments, the insulating region 302 includes a dielectric material with a high refractive index including $SiN_x$; any other suitable material; or combinations thereof. In some embodiments, the insulating region 302 includes a dielectric material with a low refractive index including $SiO_2$; low-k dielectric; any other suitable material; or combinations thereof. In some embodiments, the insulating region 302 is formed by CVD, spin-on polymeric dielectric or other processes. In some embodiments, the thickness of the insulating region 302 ranges from about 3 μm to about 10 μm. In some embodiments, the insulating region 302 includes one or more layers. In some embodiments, the insulating region 302 is a transparent material. In some embodiments, the insulating region 302 is a same material as the second passivation region 210. In some embodiments, the insulating region 302 is a different material as the second passivation region 210.

In some embodiments, EOM/VCSEL structure 300 is a resonant modulator which operates with lower input power when compared with conventional high-bias current VCSEL. In some embodiments, EOM/VCSEL structure 300 is an integrated EOM-VCSEL device with lower operating powers resulting in improved yield and device lifetime. In some embodiments, EOM/VCSEL structure 300 is an integrated EOM-VCSEL device which is directly integrated with electronic circuits. In some embodiments, EOM/VCSEL structure 300 is an integrated EOM-VCSEL device with improved control of the ARC layers 108a, 108b and 108c. In some embodiments, EOM/VCSEL structure 300 is an integrated EOM-VCSEL device with improved control of the first upper reflecting layers 120a, 120b, 120c and 120d. In some embodiments, EOM/VCSEL structure 300 is configured to operate with a bandwidth of about 50 Gigahertz (GHz). In some embodiments, EOM/VCSEL structure 300 is configured to output an infrared modulated signal with a waist of about 20 μm or less. In some embodiments, EOM/VCSEL structure 300 is configured to output an infrared signal for use in a single-mode optical fiber. In some embodiments, EOM/VCSEL structure 300 is configured to output an infrared signal for use in a multi-mode optical fiber. In some embodiments, EOM/VCSEL structure 300 is configured to output an infrared modulated signal with a wavelength ranging from about 925 nm to about 2000 nm. In some embodiments, the EOM/VCSEL structure 300 is usable for optical communications. In some embodiments, EOM/VCSEL structure 300 is configured to output a modulated signal to contain data. In some embodiments, EOM/VCSEL structure 300 is configured to output a modulated signal that is tunable. In some embodiments, EOM/VCSEL structure 300 is configured to output an amplitude modulated signal. In some embodiments, EOM/VCSEL structure 300 is configured to output a frequency modulated signal. In some embodiments, EOM/VCSEL structure 300 is configured to output a phase modulated signal. In some embodiments, EOM/VCSEL structure 300 is configured to output a polarization modulated signal.

Figure 4:
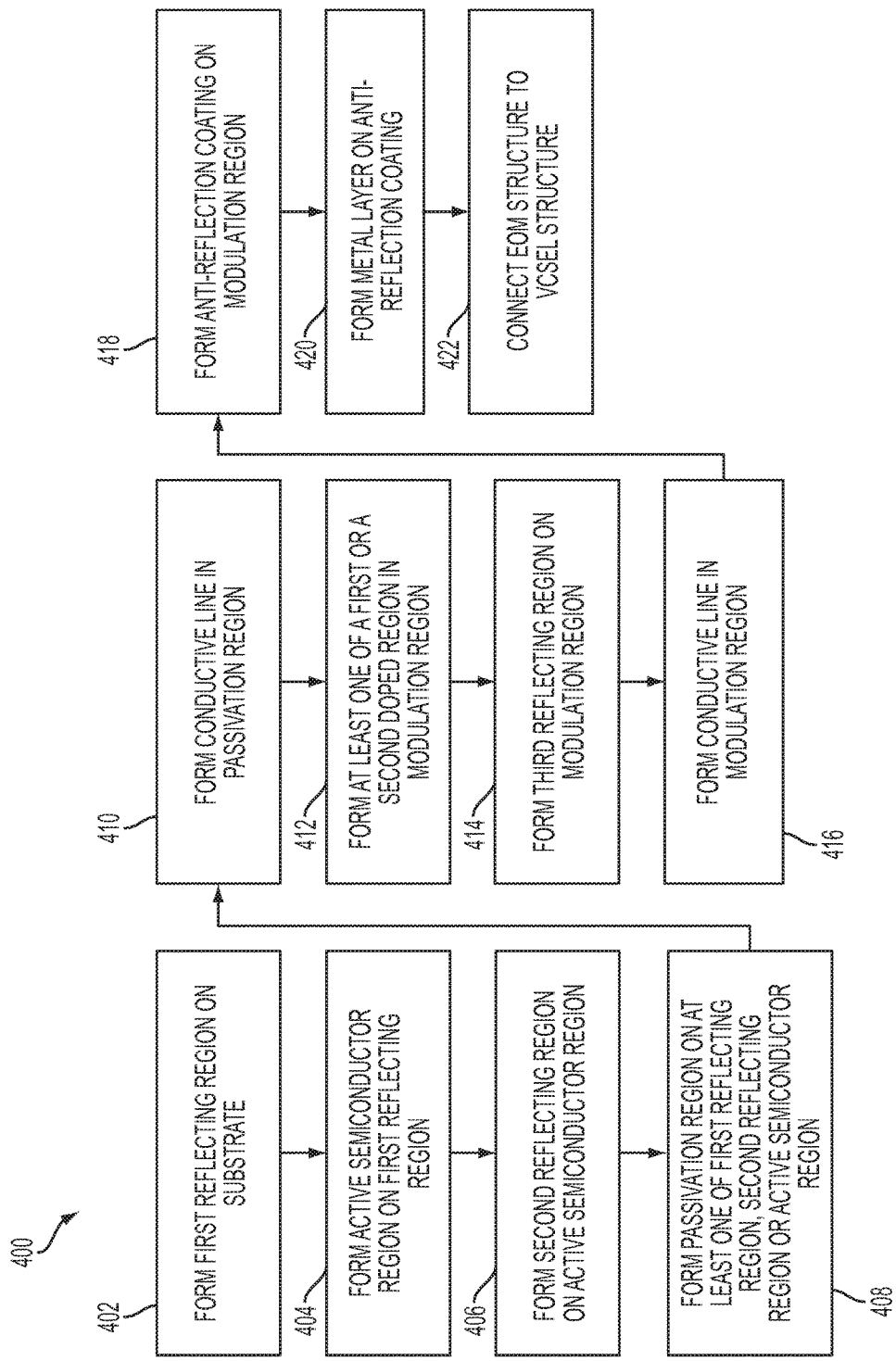
FIG. 4 is a flow chart of a method of making an EOM/VCSEL structure in accordance with one or more embodiments.

FIG. 4 is a flow chart of a method 400 of making a VCSEL/EOM structure in accordance with one or more embodiments. Method 400 begins with operation 402 in which a first reflecting region, e.g., first lower reflecting region 204 (FIG. 2), is formed over a first substrate, e.g., first substrate 202 (FIG. 2). In some embodiments, the first reflecting region is formed using CVD, ALD, or other suitable formation processes.

Method 400 continues with operation 404 in which an active semiconductor region, e.g., active semiconductor region 206 (FIG. 2), is formed over the first reflecting region, e.g., first lower reflecting region 204 (FIG. 2). In some embodiments, the active semiconductor region is formed using a deposition process, e.g., metalorganic chemical vapour deposition (MOCVD), Molecular Beam Epitaxy (MBE), or other suitable formation processes.

Method 400 continues with operation 406 in which a second reflecting region, e.g., second upper reflecting region 208 (FIG. 2), is formed over an active semiconductor region, e.g., active semiconductor region 206 (FIG. 2). In some embodiments, the second reflecting region is formed using CVD, ALD, or other suitable formation processes.

Method 400 continues with operation 408 in which a passivation region, e.g., passivation region 210 (FIG. 2), is formed over the first reflecting region, e.g., first lower reflecting region 204 (FIG. 2), second reflecting region, e.g., second upper reflecting region 208 (FIG. 2), or the active semiconductor region, e.g., active semiconductor region 206 (FIG. 2). In some embodiments, the passivation region is formed using CVD, spin-on polymeric dielectric or other suitable formation processes.

Method 400 continues with operation 410 in which at least one conductive line, e.g., third conductive line 212 (FIG. 2) or fourth conductive line 216 (FIG. 2), is formed in the passivation region, e.g., second passivation region 210 (FIG. 2). In some embodiments, the conductive line is formed using a combination of photolithography and material removal processes to form openings in the passivation region. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Method 400 continues with operation 412 in which at least one P- or N-doped region, e.g., first doped region 110 or second doped region 118, is formed in a modulation region, e.g., a modulation region 112 (FIG. 1). In some embodiments, at least one P- or N-doped region is doped with dopants suitable for Silicon, Silicon/Germanium and Germanium. In some embodiments, the P- or N-doped regions formed using implantation, diffusion or other suitable formation processes.

Method 400 continues with operation 414 in which a third reflecting region, e.g., first upper reflecting region 120 (FIG. 1), is formed over modulation region, e.g., modulation region 112 (FIG. 1). In some embodiments, the third reflecting region is formed over the modulation region by backside illuminated processes, KOH backside etch processes with an implantation etch stop, CVD, ALD, or other suitable formation processes.

Method 400 continues with operation 416 in which at least one conductive line, e.g., first conductive line 114 (FIG. 1) or second conductive line 124 (FIG. 1), is formed in the modulation region, e.g. modulation region 112 (FIG. 1). In some embodiments, the conductive line is formed using a combination of photolithography and material removal processes to form openings in the modulation region. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process.

The openings are then filled with conductive material, e.g., copper, aluminum, titanium, nickel, tungsten, or other suitable conductive material. In some embodiments, the openings are filled using CVD, PVD, sputtering, ALD or other suitable formation process.

Method 400 continues with operation 418 in which an Anti-Reflection Coating, e.g., ARC region 108 (FIG. 1), is formed over an opposite side of modulation region, e.g., modulation region 112 (FIG. 1). In some embodiments, the Anti-Reflection Coating is formed using CVD, ALD, PVD, or other suitable formation processes.

Method 400 continues with operation 420 in which at least one conductive layer, e.g., base conductive line 102a (FIG. 1) or base conductive line 102b (FIG. 1), is formed in the Anti-Reflection Coating, e.g. ARC region 108 (FIG. 1). In some embodiments, the conductive layer is formed using a combination of photolithography and material removal processes to form openings in the Anti-Reflection Coating. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Method 400 continues with operation 420 in which the EOM structure, e.g. EOM structure 100 (FIG. 1), is connected to the VCSEL structure, e.g., VCSEL structure 200 (FIG. 2). In some embodiments, the EOM structure is connected to the VCSEL structure using a laser bonding process, a conductive adhesive layer, a soldering bump process or another suitable bonding process.

One of ordinary skill in the art would recognize that an order of operations in method 400 is adjustable. One of ordinary skill in the art would further recognize that additional steps are able to be included in method 400 without departing from the scope of this description.

One aspect of this description relates to an electro-optic modulator device including a modulation region, a reflecting region, a conductive line and an anti-reflecting region. The modulation region includes a doped region. The reflecting region is over the modulation region. The conductive line is connected to the doped region. The conductive line extends through the reflecting region. The anti-reflecting region is on an opposite surface of the modulation region from the reflecting region.

Another aspect of this description relates to an optical device comprising a laser and an electro-optic modulator. The laser is bonded to the electro-optic modulator, the laser is configured to generate a light, and the electro-optic modulator is configured to output a modulated light responsive to the light received from the laser. The laser comprising a semiconductor region over a first reflecting region; and a second reflecting region over the semiconductor region. The electro-optic modulator comprising a modulation region over an anti-reflecting region, the modulation region comprising a first doped region; and a third reflecting region over the modulation region.

Still another aspect of this description relates to a method of making an optical device, the method comprising: forming an electro-optic modulator device. Forming an electro-optic modulator device comprises: forming a first doped region in a modulation region; depositing a plurality of reflecting layers on the modulation region; forming a first conductive line in the modulation region, the first conductive line electrically connected to the first doped region, and extending through the plurality of reflecting layers; and depositing a plurality of anti-reflecting layers on an opposite surface of the modulation region from the plurality of reflecting layers.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of forming an electro-optic modulator device, the method comprising:
    forming a first doped contact region at a major surface of a semiconductor modulation region;
    forming a second doped contact region at an opposite major surface of the semiconductor modulation region;
    depositing on the major surface a stack of anti-reflecting materials with alternating high and low refractive indices;
    depositing on the opposite major surface of the semiconductor modulation region, a reflecting region; and
    forming a conductive line extending through the reflecting region and the semiconductor modulation region, and electrically connected to the first doped contact region.

2. The method of claim 1, further comprising forming on the stack of anti-reflecting materials a base conductive layer having a first base conductive line, a second base conductive line, and a hole between the first and second base conductive line, a portion of the anti-reflecting material being exposed by the hole to incoming radiation.

3. The method of claim 1, wherein forming a doped contact region at a major surface of a semiconductor modulation region includes forming a p-doped layer and an n-doped layer.

4. The method of claim 1, further comprising forming a second conductive line extending through the reflecting region and electrically contacting the second doped contact region.

5. The method of claim 1, wherein depositing on the major surface a stack of anti-reflecting materials with alternating high and low refractive indices includes depositing materials selected from the group consisting of $SiO_2$, SiN, SiON, low-k dielectrics, and combinations thereof.

6. The method of claim 1, wherein depositing on the opposite surface a reflecting region includes depositing a stack of alternating reflecting materials with alternating high and low refractive indices.

7. The method of claim 6, wherein the stack of alternating reflecting materials include layers of material selected from the group consisting of $SiN_x$ (x>1), AlN, Si, high-k dielectrics and combinations thereof, alternating with layers of material selected from the group consisting of $SiO_2$, low-k dielectrics and combinations thereof.

8. The method of claim 1, further comprising forming a passivation layer extending circumferentially around the conductive line.

9. A method comprising:
    forming a laser structure, comprising:

depositing a first reflecting region on a substrate;
depositing a first semiconductor region on the first reflecting region;
depositing a second reflecting region on the first semiconductor region;
forming a first passivation region on the first reflecting region, and/or the second reflecting region, and/or the first semiconductor region; and
forming a first conductive line in the first passivation region;

forming an optical structure, comprising:
forming a doped region in a modulation region;
forming a third reflecting region on the modulation region;
forming a second conductive line in the modulation region and extending through the third reflecting region, the second conductive line electrically connected to the doped region;
depositing an anti-reflection coating on the modulation region; and
forming a metal layer on the anti-reflection coating; and
connecting the laser structure and the optical structure.

10. The method of claim 9, further comprising forming a second doped region in the modulation region adjacent to the reflecting region, and forming a third conductive line electrically connected to the second doped region.

11. The method of claim 9, further comprising forming an insulating material between the laser structure and the optical structure and electrically connecting a first feature of the first metal layer to the first conductive line.

12. The method of claim 9, wherein the laser structure is connected to the optical structure using a laser bonding process, a conductive adhesive, or a solder bump process.

13. The method of claim 9 further comprising positioning a top of the top surface of the first reflecting region a predetermined distance from a top surface of the modulation region.

14. The method of claim 9, further comprising:
forming a metallization layer on the passivation region, the patterned metallization layer having an opening therethrough the opening allowed radiation to pass therethrough;
forming a second opening in the metal layer of the optical structure, the second opening allowing radiation to pass therethrough; and
aligning the opening and the second opening prior to connecting the laser structure and the optical structure.

15. The method of claim 9, further comprising forming in the modulation region at least one quantum well.

16. The method of claim 15, further wherein the at least one quantum well includes a multiple quantum well including multiple quantum well layers.

17. An electro-optic modulator device comprising:
a first opening between a first base conductive line and a second base conductive line;
an anti-reflective coating region over the first opening, the first base conductive line, and the second base conductive line;
a modulation region over the anti-reflective coating region, the modulation region comprising a first doped region and a second doped region;
a reflecting region over the modulation region;
a first conductive line connected to the first doped region, wherein the first conductive line extends through the reflecting region;
a second conductive line connected to the second doped region;
a first conductive layer over the first conductive line;
a second conductive layer over the second conductive line; and
a second opening between the first conductive layer and the second conductive layer.

18. The electro-optic modulator device of claim 17, further comprising a radiation source bonded to the first base conductive line and the second base conductive line.

19. The electro-optic modulator device of claim 17, wherein the first base conductive line is electrically connected to a first reflecting region of the radiation source and the second base conductive line is electrically connected to a second reflecting region of the radiation source.

20. The electro-optic modulator device of claim 19, wherein the radiation source is configured to received modulation control signals via the first base conductive line and the second base conductive line.

* * * * *